US006294465B1

(12) United States Patent
Hernandez et al.

(10) Patent No.: US 6,294,465 B1
(45) Date of Patent: Sep. 25, 2001

(54) METHOD FOR MAKING INTEGRATED CIRCUITS HAVING FEATURES WITH REDUCED CRITICAL DIMENSIONS

(75) Inventors: Jose Luis Hernandez, Madrid; Carlos De Miguel Gil, Majadahonda; Ines Vincueria Morena, San Agustin del Guadalix, all of (ES)

(73) Assignee: Agere Systems Guardian Corp., Murray Hill, NJ (US)

( * ) Notice: Subject to any disclaimer, the term of this patent is extended or adjusted under 35 U.S.C. 154(b) by 0 days.

(21) Appl. No.: 09/430,147

(22) Filed: Oct. 29, 1999

(51) Int. Cl.⁷ .................................................... H01L 21/44
(52) U.S. Cl. ......................... 438/669; 438/636; 438/671; 438/688
(58) Field of Search .................................. 438/636, 669, 438/671, 688, 761

(56) References Cited

U.S. PATENT DOCUMENTS

| | | | | |
|---|---|---|---|---|
| 5,397,433 | * | 3/1995 | Gabriel ................................. | 438/713 |
| 5,525,542 | * | 6/1996 | Maniar et al. ........................ | 438/669 |
| 5,846,878 | * | 12/1998 | Horiba ................................. | 438/636 |
| 5,915,203 | * | 6/1999 | Sengupta et al. .................... | 438/669 |

FOREIGN PATENT DOCUMENTS 3-20745 * 1/1991 (JP).

OTHER PUBLICATIONS

*IEEE Spectrum* Jul. 1999, vol. 36, No. 7. Article: "Ultralight Lithography", pp. 35–40. (W/copies of tables, figures, etc.).

* cited by examiner

Primary Examiner—Stephen D. Meier
Assistant Examiner—Jamie L. Brophy
(74) Attorney, Agent, or Firm—Alan, Dyer, Doppelt, Milbrath & Gilchrist, P.A.

(57) ABSTRACT

A method for making an integrated circuit includes forming an aluminum layer adjacent a semiconductor wafer, and forming a photoresist layer adjacent the aluminum layer, with at least a portion of the aluminum layer being uncovered. The method also includes exposing the photoresist layer to a pattern image, developing the exposed photoresist layer using a developer and stripping away undeveloped photoresist portions to define a mask including mask features having reduced widths than would otherwise occur adjacent the aluminum layer. The reduced widths are based upon an interaction between the photoresist, the developer and the aluminum. The method may include etching the aluminum layer using the mask to thereby define circuit features having a smaller critical dimension than would otherwise be produced.

26 Claims, 4 Drawing Sheets

METHOD FOR MAKING INTEGRATED CIRCUITS HAVING FEATURES WITH REDUCED CRITICAL DIMENSIONS

FIELD OF THE INVENTION

The present invention relates to the field of semiconductors, and, more particularly, to a method for making integrated circuits on a semiconductor wafer.

BACKGROUND OF THE INVENTION

Integrated circuits are widely used in electronic devices, such as computers, cellular telephones, entertainment systems, etc. A typical integrated circuit includes a semiconductor substrate with a plurality of active regions formed therein. These active regions may be interconnected by various conductive or metal lines formed in layers on the substrate. Accordingly, an integrated circuit may include millions of transistors, for example.

As the densities of integrated circuits are continually increased, each feature, such as the width of a metal line, or the width of a polygate oxide layer, is continually reduced. Smaller features permit faster operation, less power consumption and more complicated functions to be performed. Such features are typically defined by selective exposure of a photoresist layer on a semiconductor wafer to a pattern imaged from a mask or reticle in a process generally known as optical lithography or photolithography. The exposed photoresist layer portions may be made etch resistant upon exposure to the image, for example. The non-exposed portions may then be removed leaving the desired photoresist pattern. The chemistry of the photoresist may also provide that exposed portions are etched and non-exposed portions remain. The remaining resist portions are then typically used to provide elective etching of the underlying integrated circuit portions.

The resolution, and hence minimum feature size, is related to the wavelength of light used in the photolithography. The so-called Rayleigh resolution criteria will soon define the limit of physics for imaging the ever-shrinking feature size in integrated circuit manufacturing. Continuing developments have allowed optical lithography to keep pace with the demand for decreasing feature sizes. As noted in the IEEE Spectrum article "Ultralight Lithography" appearing at pp. 35–40, in July 1999, the lifetime of a given lithography generation is modified until a complete change to a next generation technology is made. In other words, various corrective measures are taken to help pattern smaller features, and which is limited by the wavelength of light used. Typical corrective techniques include optical proximity correction (OPC) and the use of phase-shift masks. However, such phase-shift masks and OPC masks can be relatively expensive.

SUMMARY OF THE INVENTION

In view of the foregoing background, it is therefore an object of the present invention to provide a method for making integrated circuits having smaller feature sizes.

This and other objects, features and advantages in accordance with the present invention are provided by a method for making an integrated circuit which relies upon an interaction between the photoresist, the developer, and an aluminum layer which is at least partly uncovered on the semiconductor wafer.

The method preferably includes the steps of forming an aluminum layer adjacent a semiconductor wafer, forming a photoresist layer adjacent the aluminum layer with at least a portion of the aluminum layer being uncovered, and exposing the photoresist layer to a pattern image. Moreover, the method also preferably includes developing the exposed photoresist layer using a developer and stripping away undeveloped photoresist portions to define a mask including mask features having reduced widths than would otherwise occur adjacent the aluminum layer. The reduced widths are based upon an interaction between the photoresist, the developer and the aluminum. The method may also include etching the aluminum layer using the mask having the reduced widths to thereby define circuit features having a smaller critical dimension than would otherwise be produced.

BRIEF DESCRIPTION OF THE DRAWINGS

Some of the features, advantages, and benefits of the present invention having been stated, others will become apparent as the description proceeds when taken in conjunction with the accompanying drawings in which.

DETAILED DESCRIPTION OF THE PREFERRED EMBODIMENT

The present invention will now be described more fully hereinafter with reference to the accompanying drawings, in which preferred embodiments of the invention are shown. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art.

Figure 1:
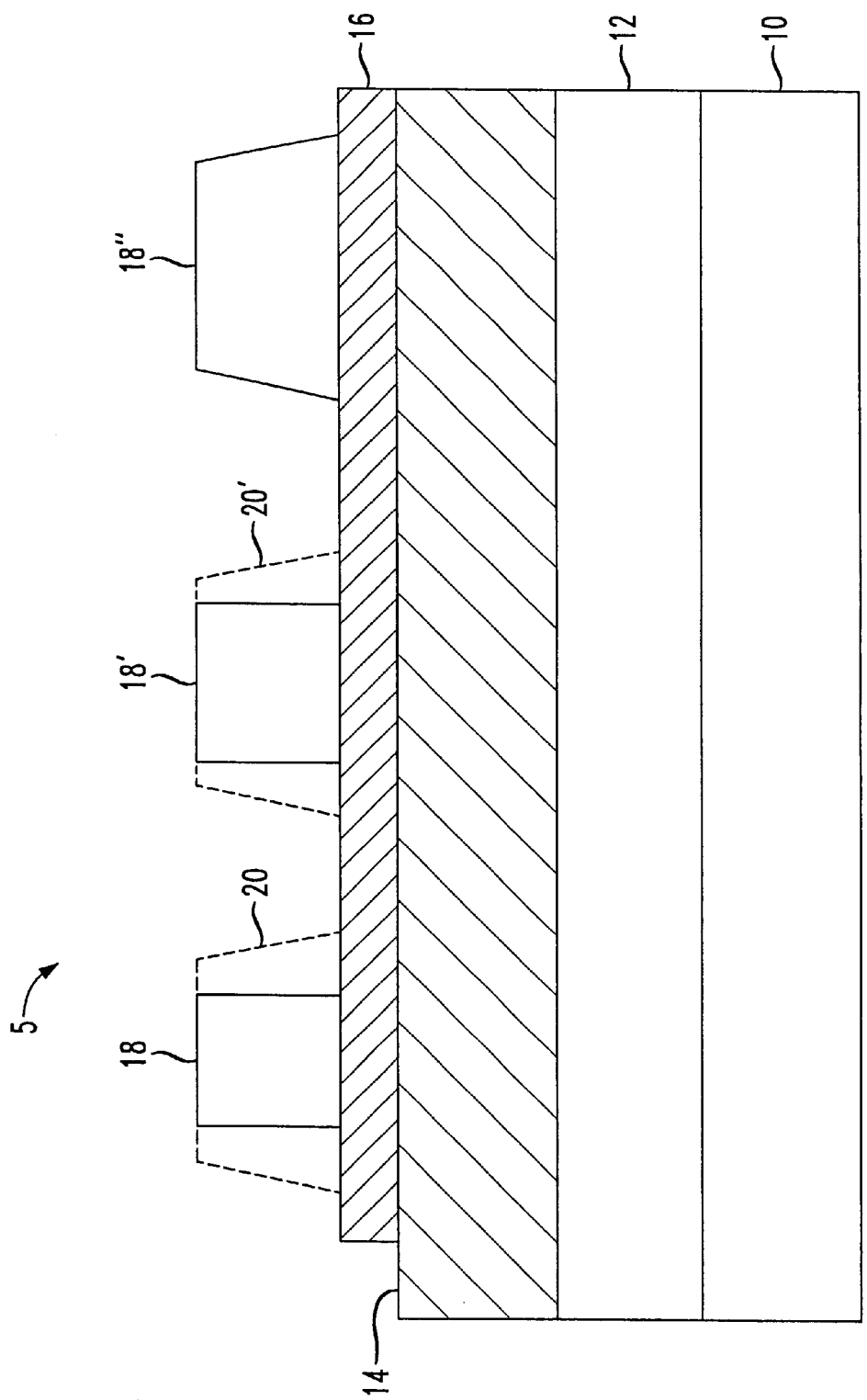
FIG. 1 is a schematic cross-sectional view of a semiconductor wafer processed according to the present invention.
Figure 2:
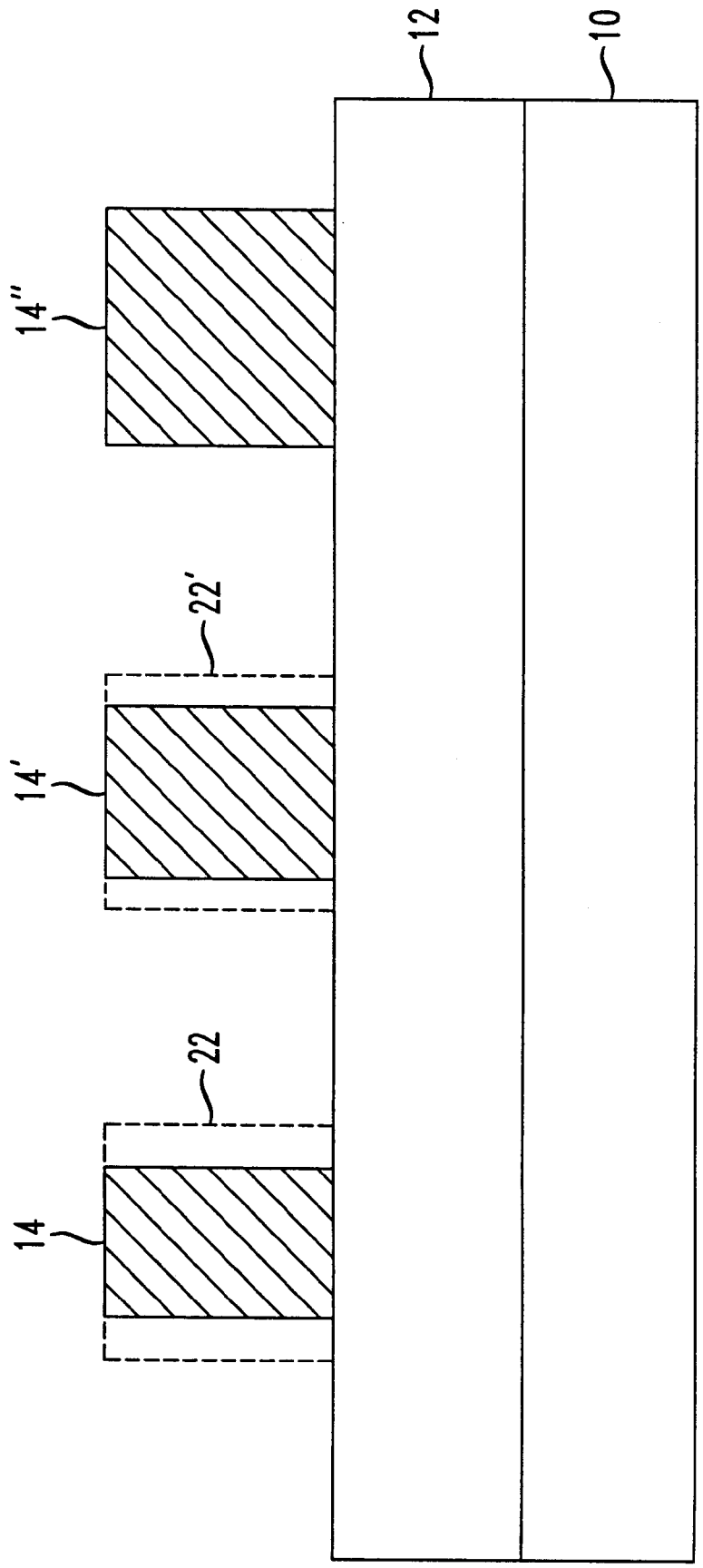
FIG. 2 is a schematic cross-sectional view of the semiconductor wafer of FIG. 1 after etching.
Figure 3:
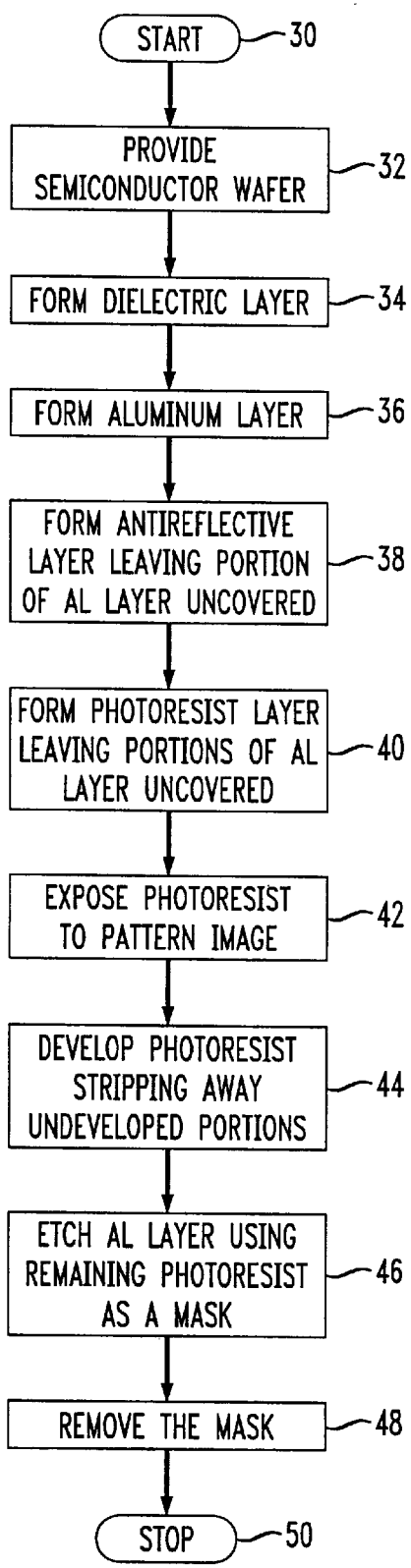
FIG. 3 is a flow chart illustrating the method of making integrated circuits according to an embodiment of the present invention.

The method described herein for making an integrated circuit, and as illustrated in FIGS. 1–3, is directed to making an integrated circuit having smaller critical dimensions than would otherwise be produced by a standard fabrication process. FIG. 1 illustrates a semiconductor wafer 5 having a substrate 10, and thereon a layer of a barrier metal such as titanium nitride 12, a layer of aluminum 14 which remains at least partly uncovered, an antireflective layer 16, and photoresist features 18, 18', and 18". The method relies upon an interaction between the photoresist, developer, and the at least partly uncovered aluminum layer 14 on the semiconductor wafer 5, as shown in FIG. 1. In accordance with the invention, photoresist features are produced so as to have a reduced width. In addition, the distance from the photoresist feature to the uncovered aluminum layer 14 may be inversely proportional to the width reduction effect. As illustrated in FIG. 1, for example, a photoresist feature 18 which is closer to the uncovered aluminum layer 14 will evidence width reduction to a greater degree compared to a photoresist feature 18' which is farther away from the uncovered aluminum layer 14. As best seen in FIG. 1, the photoresist feature 18 closest to the uncovered aluminum layer 14 undergoes a greater reduction in width, as shown by the dotted normal width outline 20, than the adjacent feature 18' which sustains a smaller reduction in width, shown by the dotted normal width outline 20'. A photoresist feature 18" some further distance away from the uncovered aluminum layer 14 may show no significant reduction at all.

The method, as illustrated in the flow chart shown in FIG. 3, from the start (Block 30) includes a first step of providing a semiconductor wafer (Block 32). The method may include forming a dielectric layer on the semiconductor wafer (Block 34). A subsequent step includes forming an aluminum layer (Block 36). Those skilled in the art will appreciate that the aluminum layer may be formed on a variety of other layers, and is not limited in its position to the examples shown in the figures for purposes of illustration. For example, a barrier layer TiN could be beneath the aluminum layer. One preferred example of such an aluminum layer is a layer comprising aluminum, about 0.75% Si, and about 0.5% Cu.

The method may further include forming an antireflective layer on the aluminum layer, leaving at least a portion of the aluminum layer uncovered (Block 38). In yet another embodiment of the method, the antireflective layer preferably comprises a refractory metal nitride.

A further step in the method comprises forming a photoresist layer adjacent the aluminum layer, such that at least a portion of the aluminum layer remains uncovered (Block 40). A preferred example of photoresist for use in this method is Shipley's SPR513dyed photoresist.

Another step includes exposing the photoresist layer to a pattern image (Block 42). A following step includes developing the exposed photoresist layer using a developer and stripping away undeveloped portions (Block 44) to define remaining photoresist portions having reduced widths adjacent the aluminum layer based upon an interaction between the photoresist, the developer and the aluminum. An example of a preferred developer for use with the method of the present invention is Shipley's MF505.

A further step comprises etching the aluminum layer using the remaining photoresist portions with the reduced widths as a mask (Block 46) to thereby define circuit features having a smaller critical dimension than would otherwise be produced. Additionally, the method may comprise the step of removing the remaining photoresist portions after the etching step to thereby remove the mask (Block 48). In the method, the photoresist may preferably be a positive photoresist comprising a photosensitive compound, a base resin, and an organic solvent. After removing the mask, the process stops (Block 50).

The method may further comprise the step of designing a reticle to form the pattern image to account for the reduced widths of the remaining photoresist portions. The photoresist portions may preferably define reduced width profiles having substantially vertical sidewalls, or inwardly tapering sidewalls. In another preferred embodiment of the invention, the etched aluminum layer defines an interconnect level for the integrated circuit.

Figure 4:
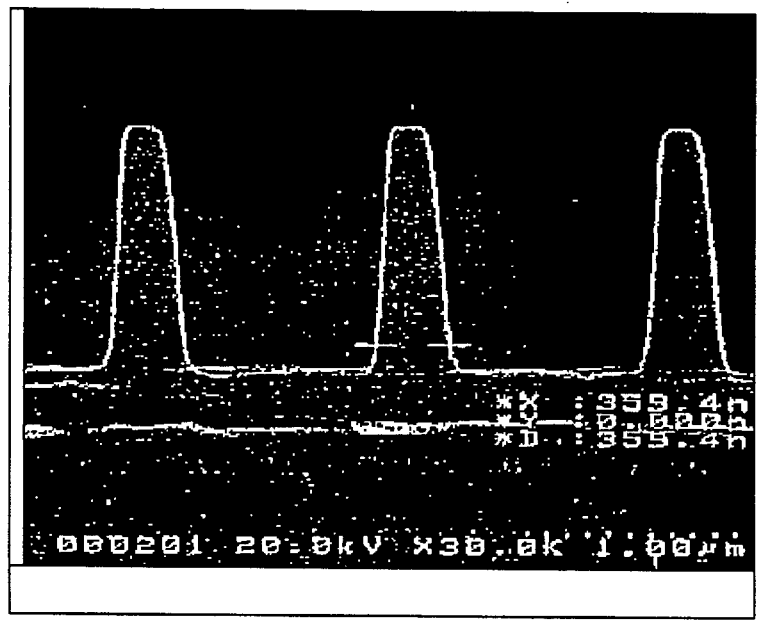
FIG. 4 is a photomicrograph of a cross-section of photoresist features resulting from a prior art process.
Figure 5:
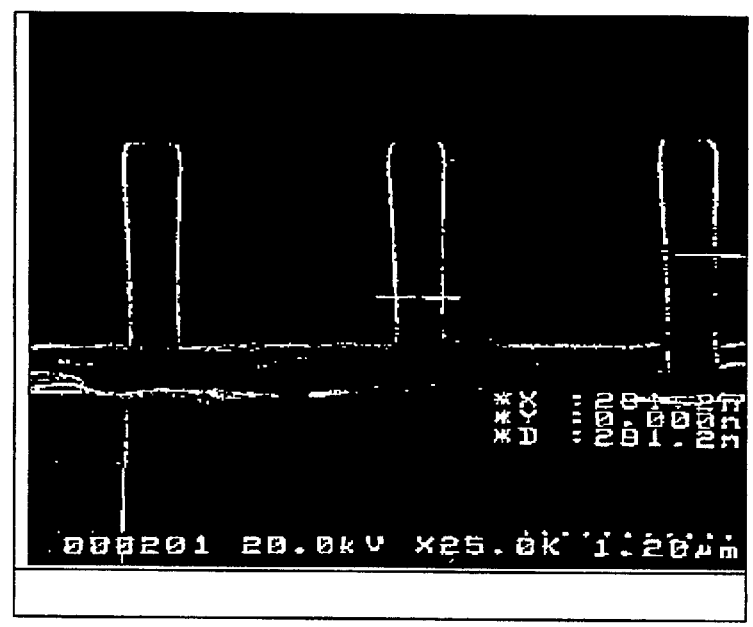
FIG. 5 is a photomicrograph of a cross-section of photoresist features resulting from the method of the invention.

The reduced width of photoresist features of the present method is demonstrated in the comparative photomicrographs of cross-sections of processed semiconductor wafers in FIGS. 4 and 5. Photoresist features from a prior art method of processing semiconductor wafers are shown in FIG. 4. As noted in FIG. 4, the photoresist features of the prior art have been measured, and have a feature width at the base of about 359 nm. In contrast, an example of photoresist features of the present invention is shown in FIG. 5. The width of the photoresist features produced by the present method, as shown in FIG. 5, is notably different from that of the prior art features, shown in FIG. 4. Photoresist features produced by the present method, and shown in FIG. 5, have a base width of about 281 nm. As illustrated, the reduction in base width through the present method is significant, representing a greater than 20% reduction in photoresist feature size. Smaller feature sizes of the photoresist will translate into smaller circuit features. For example, smaller circuit features may result in power savings, for example, as will be readily appreciated by those skilled in the art.

Many modifications and other embodiments of the invention will come to the mind of one skilled in the art, having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making an integrated circuit comprising the steps of:

forming an aluminum layer adjacent a semiconductor wafer;

forming a photoresist layer adjacent the aluminum layer with at least a portion of the aluminum layer being uncovered;

exposing the photoresist layer to a pattern image;

developing the exposed photoresist layer using a developer and stripping away undeveloped photoresist portions to define a mask including mask features having reduced widths than would otherwise be produced adjacent the aluminum layer and based upon an interaction between the photoresist, the developer and the aluminum; and etching the aluminum layer using the mask including features having the reduced widths to thereby define circuit features having a smaller critical dimension than would otherwise be produced.

2. A method according to claim 1, further comprising the step of designing a reticle to form the pattern image to account for the reduced widths of the mask features.

3. A method according to claim 1, wherein the mask features define profiles with substantially vertical sidewalls.

4. A method according to claim 1, further comprising the step of forming an antireflective layer on the aluminum layer prior to the step of forming the photoresist layer.

5. A method according to claim 1, wherein the antireflective layer comprises a refractory metal nitride.

6. A method according to claim 1, further comprising the step of removing the mask after the etching step.

7. A method according to claim 1, wherein the photoresist is a positive photoresist comprising a photosensitive compound, a base resin, and an organic solvent.

8. A method according to claim 1, wherein the etched aluminum layer defines an interconnect level for the integrated circuit.

9. A method according to claim 1, further comprising the step of forming a dielectric layer adjacent the semiconductor wafer, and wherein the aluminum layer is formed on the dielectric layer.

10. A method for making an integrated circuit comprising the steps of:

forming a metal layer adjacent a semiconductor wafer;

forming a positive photoresist layer adjacent the metal layer, with at least a portion of the metal layer being uncovered;

exposing the photoresist layer to a pattern image;

developing the exposed photoresist layer using a developer and stripping away undeveloped photoresist portions to define a mask including mask features having reduced widths than would otherwise be produced adjacent the metal layer and based upon an interaction between the photoresist, the developer and the metal; and etching the metal layer using the mask including mask features having the reduced widths to thereby define circuit features having a smaller critical dimension than would otherwise be produced.

11. A method according to claim 10, further comprising the step of designing a reticle to form the pattern image to account for the reduced widths of the mask features.

12. A method according to claim 10, wherein the metal comprises aluminum.

13. A method according to claim 10, wherein the remaining photoresist portions define profiles with substantially vertical sidewalls.

14. A method according to claim 10, further comprising the step of forming an antireflective layer on the metal layer prior to the step of forming the photoresist layer.

15. A method according to claim 14, wherein the antireflective layer comprises a refractory metal nitride.

16. A method according to claim 10, further comprising the step of removing the mask after the etching step.

17. A method according to claim 10, wherein the positive photoresist comprises a photosensitive compound, a base resin, and an organic solvent.

18. A method according to claim 10, wherein the etched metal layer defines an interconnect level for the integrated circuit.

19. A method according to claim 10, further comprising the step of forming a dielectric layer adjacent the semiconductor wafer, and wherein the metal layer is formed on the dielectric layer.

20. A method for making an integrated circuit comprising the steps of:

forming a dielectric layer adjacent a semiconductor wafer;

forming an aluminum layer adjacent the dielectric layer;

forming a photoresist layer adjacent the aluminum layer with at least a portion of the aluminum layer being uncovered;

exposing the photoresist layer to a pattern image;

developing the exposed photoresist layer using a developer and stripping away undeveloped photoresist portions to define a mask including mask features having reduced widths than would otherwise be produced adjacent the aluminum layer and based upon an interaction between the photoresist, the developer and the aluminum; and etching the aluminum layer using the mask including features having the reduced widths to thereby define circuit features having a smaller critical dimension than would otherwise be produced.

21. A method according to claim 20, further comprising the step of designing a reticle to form the pattern image to account for the reduced widths of the remaining photoresist portions.

22. A method according to claim 20, wherein the mask features define profiles with substantially vertical sidewalls.

23. A method according to claim 20, further comprising the step of forming an antireflective layer on the aluminum layer prior to the step of forming the photoresist layer.

24. A method according to claim 23, wherein the antireflective layer comprises a refractory metal nitride.

25. A method according to claim 20, further comprising the step of removing the mask after the etching step.

26. A method according to claim 20, wherein the photoresist is a positive photoresist comprising a photosensitive compound, a base resin, and an organic solvent.

* * * * *

UNITED STATES PATENT AND TRADEMARK OFFICE
CERTIFICATE OF CORRECTION

PATENT NO.   : 6,294,465 B1
DATED        : September 25, 2001
INVENTOR(S)  : Jose Luis Hernandez, Carlos De Miguel Gil and Ines Vincueria Moreno It is certified that error appears in the above-identified patent and that said Letters Patent is hereby corrected as shown below:

<u>Title page,</u>
Item [75], delete "Ines Vincueria Morena" insert -- Ines Vincueria Moreno --

<u>Column 3,</u>
Line 30, delete "SPR513dyed" insert -- SPR513 dyed --

<u>Column 4,</u>
Line 48, delete "claim 1," insert -- claim 4, --

Signed and Sealed this

Sixth Day of August, 2002

Attest:

Attesting Officer

JAMES E. ROGAN
*Director of the United States Patent and Trademark Office*